United States Patent
Inoue et al.

(10) Patent No.: US 6,310,370 B1
(45) Date of Patent: *Oct. 30, 2001

(54) SOLID STATE IMAGE SENSING DEVICE AND METHOD OF MANUFACTURING THE SAME

(75) Inventors: Tetsuhiro Inoue; Kazuhiro Miyagawa, both of Gifu-ken (JP)

(73) Assignee: Sanyo Electric Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/174,027

(22) Filed: Oct. 16, 1998

(30) Foreign Application Priority Data

Oct. 21, 1997 (JP) .................................................. 9-288394

(51) Int. Cl.[7] ........................ H01L 27/148; H01L 29/768
(52) U.S. Cl. .......................... 257/241; 257/243; 257/249; 257/250
(58) Field of Search ................................... 257/241, 243, 257/249, 250

(56) References Cited

U.S. PATENT DOCUMENTS

| | | | | |
|---|---|---|---|---|
| 5,255,099 | * | 10/1993 | Orihara . | |
| 5,256,890 | * | 10/1993 | Furukawa et al. | 257/233 |
| 5,399,888 | * | 3/1995 | Nakashiba | 257/233 |
| 5,506,429 | * | 4/1996 | Tanaka et al. | 257/233 |
| 5,614,741 | * | 3/1997 | Harada et al. | 257/233 |
| 5,912,482 | * | 6/1999 | Morimoto | 257/232 |

FOREIGN PATENT DOCUMENTS 7-51799    11/1995   (JP) .

* cited by examiner

Primary Examiner—Ngân V. Ngô
(74) Attorney, Agent, or Firm—Fish & Richardson P.C.

(57) ABSTRACT

A CCD solid-state image sensing device has power supply lines formed from a poly-silicon layer and a silicide layer formed on the poly-silicon layer. The silicide layer has a reduced optical reflectivity that inhibits reflections of light on a surface of the power supply line. The silicide layer is silicon combined with a refractory metal, such as tungsten, molybdenum, titanium, or the like. Further, a surface protective film is formed on the power supply lines. The surface protective film includes silicon nitride having an increased quantity of hydrogen that is supplied to an interface between a channel layer and a diffusion layer in order to promote bonding.

8 Claims, 4 Drawing Sheets

SOLID STATE IMAGE SENSING DEVICE AND METHOD OF MANUFACTURING THE SAME

BACKGROUND OF THE INVENTION

The present invention relates to a solid-state image sensing device, and more particularly, to a CCD (charge coupled device) solid-state image sensing device employing a frame transfer system.

FIG. 1 is a schematic block diagram of a prior art CCD solid-state image sensing device 100 employing a frame transfer system. The CCD solid-state image sensing device 100 includes an image sensing part 102, a storage part 104, a horizontal transfer part 106 and an output part 108. The image sensing part 102 comprises a plurality of shift-registers (not shown) that extend in the vertical direction and are disposed parallel with each other. The shift-registers each comprise a plurality of register bits that correspond to light-receiving pixels. The storage part 104 comprises a plurality of light-blocked shift-registers (not shown) disposed adjoining the shift-registers of the image sensing part 102. Each of the storage part shift-registers comprises a plurality of register bits that form storage pixels. The horizontal transfer part 106 comprises a single shift-register (not shown) disposed extending in the horizontal direction. The transfer part shift-register comprises a plurality of shift-register bits connected with a plurality of shift-register outputs of the storage part 104, respectively. The output part 108 comprises capacitors for temporarily storing charges transferred from the horizontal transfer part 106 and reset-transistors for discharging the capacitors.

The light-receiving pixel register bits of the image sensing part 102 are transferred to the storage pixels of the storage part 104. The storage pixel bits of the storage part 104 are then transferred to the horizontal transfer part 106 in a unit of one line. The pixel data is then transferred from the horizontal transfer part 106 to the output part 108 in a unit of one pixel. A voltage that corresponds to each of the register bits is generated by the output part 108 and is output from the CCD solid-state image sensing device 100.

FIG. 2 is a schematic plan view of the image sensing part 102 which is a three phase driving type. FIG. 3A is a cross-sectional view along line 3A—3A of FIG. 2, and FIG. 3B is a cross-sectional view taken along line 3B—3B of FIG. 2.

A plurality of thick channel isolation regions 2 formed by selective oxidation are disposed parallel with each other on a surface of a P-type silicon substrate 1. N-type diffusion layers 3 are disposed between each of the channel isolation regions 2, such that the diffusion layers 3 are channel areas that are used as transfer paths by the pixel data bits. Thin gate insulation layers 4, which preferably comprise silicon dioxide films, are disposed integrally with the channel isolation regions 2 on the diffusion layers 3. A plurality of transfer electrodes 5, which preferably comprise polycrystalline silicon, are disposed parallel with each other in a direction that is perpendicular to the channel isolation regions 2. The transfer electrodes 5 are separated from each other by a constant distance on the gate insulation layers 4 and the channel isolation regions 2.

Laminated on top of the transfer electrodes 5 is an interleave insulation layer 6 which comprises the same material as the gate insulation layers 4. Power supply lines 8, which preferably comprise aluminum, are disposed on top of the interleave insulation layer 6 and extend along the channel isolation regions 2. The power supply lines 8 are connected to the transfer electrodes 5 through via holes 7 which are formed in the interleave insulation layer 6 at points of intersection between the channel isolation regions 2 and the transfer electrodes 5. For example, for a three phase drive system, each of the via holes 7 is provided for every third transfer electrode 5, whereby the power supply line 8 is connected with every third transfer electrode 5. This allows three phase transfer clocks $\phi 1$, $\phi 2$, $\phi 3$ to be applied to the transfer electrodes 5 from the power supply lines 8. Each transfer electrode 5 is fed from its associated power supply line 8 at a given spacing, and accordingly, if the transfer electrode 5 increases in length with an increase in the number of pixels, it is assured that all of entire transfer electrodes 5 accept transfer clocks $\phi 1$ to $\phi 3$ without substantial delay. As an example, Japanese Utility Model Publication No. Hei 7-51799 discloses a solid state image sensing device constructed in this manner.

In the solid state image sensing device 100, the light receiving pixel includes the channel area formed between the diffusion layer 3 which comprises silicon and the insulation layer 4 which comprises silicon oxide. Where the aluminum power supply line 8 is disposed above the transfer electrode 5, there is a likelihood that light incident to the channel area which defines the light receiving pixel may be subject to an irregular reflection by the surface of the power supply line 8 and the reflected light may impinge on light receiving pixels which are located near to the first mentioned pixel. Such light reflection may cause unnecessary charges to be developed in the light receiving pixels, causing disturbances or color shading in an image.

Where an unsaturated bond in the interface between the silicon of the channel area and the silicon oxide is compensated by hydrogen, the hydrogen is likely to be adsorbed by the aluminum of the power supply line 8. This prevents the supply of a sufficient amount of hydrogen to the interface, rendering the compensation for the unsaturated bond unsatisfactory. During a thermal treatment which introduces the hydrogen into the channel area, the temperature must be low in order to avoid melting of the power supply line 8. This necessitates a prolonged thermal treatment to ensure the supply of a sufficient amount of hydrogen to the interface.

It is an object of the invention to provide a solid state image sensing device which efficiently compensates the unsaturated bond at the silicon/silicon oxide interface of the channel area while reducing the diffuse reflection of light which is incident on respective light receiving pixels.

SUMMARY OF THE INVENTION

To achieve the above objective the present invention provides a solid state image sensing device comprising: a semiconductor substrate; a plurality of isolation regions extending in one direction on the semiconductor substrate, the isolation regions extending generally parallel to each other with a given spacing therebetween; a plurality of channel regions disposed on the semiconductor substrate between adjacent isolation regions; a plurality of transfer electrodes extending parallel to each other in a direction to intersect with the plurality of channel regions above the semiconductor substrate; and a plurality of power supply lines disposed above the plurality of transfer electrodes and extending in a direction to intersect with the transfer electrodes, wherein each of the power supply lines includes one of a refractory metal and a silicide formed by a refractory metal combined with silicon.

The present invention further provides a method of manufacturing a solid state image sensing device comprising the steps of: forming a plurality of isolation regions extending generally parallel to each other on a semiconductor substrate and forming a channel region between adjacent isolation regions; depositing a first insulation layer on the isolation regions and the semiconductor substrate on which said plurality of isolation regions and said plurality of channel regions are formed, and forming a plurality of transfer electrodes on the first insulation layer that extend in a direction to intersect with the plurality of isolation regions; depositing a second insulation layer on said plurality of transfer electrodes and forming via holes in the second insulation layer at points of intersection between the respective isolation regions and the respective transfer electrodes; forming a plurality of power supply lines on the second insulation layer that extend along the isolation regions; and depositing a third insulation layer on the power supply lines and subsequently conducting a thermal treatment; wherein each of the power supply lines comprises one of a refractory metal and a silicide formed by a refractory metal combined with silicon, and the third insulation layer comprises a silicon nitride film.

Other aspects and advantages of the invention will become apparent from the following description, taken in conjunction with the accompanying drawings, illustrating by way of example of the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
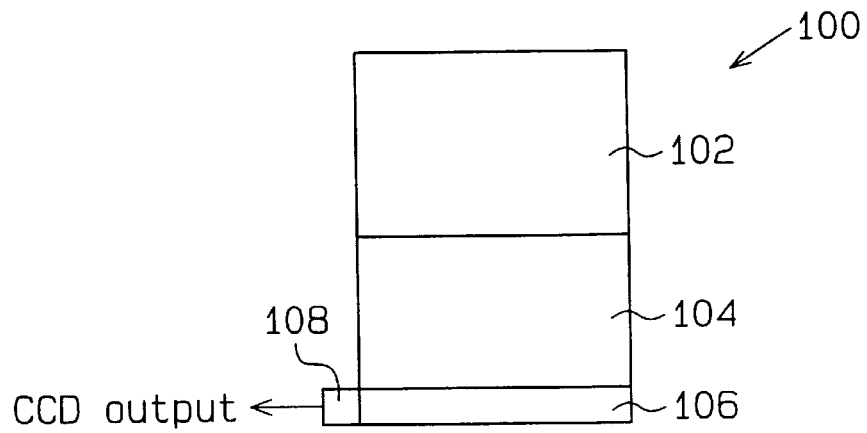
FIG. 1 is a schematic view of a conventional solid state image sensing device of a frame transfer system.
Figure 2:
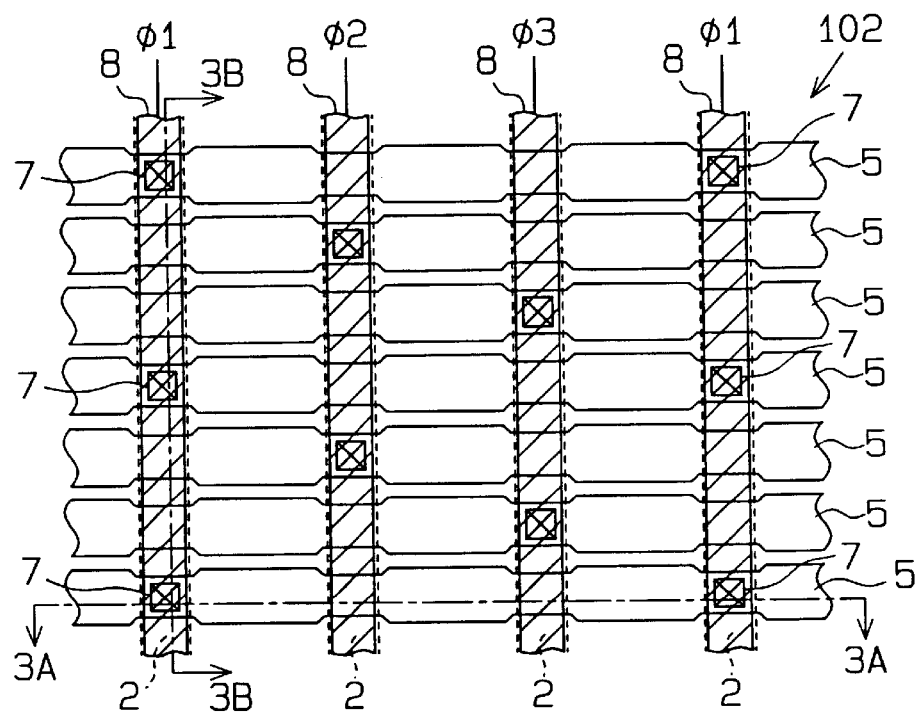
FIG. 2 is a schematic plan view of an image sensing part of a conventional solid state image sensing device.
Figure 3A:
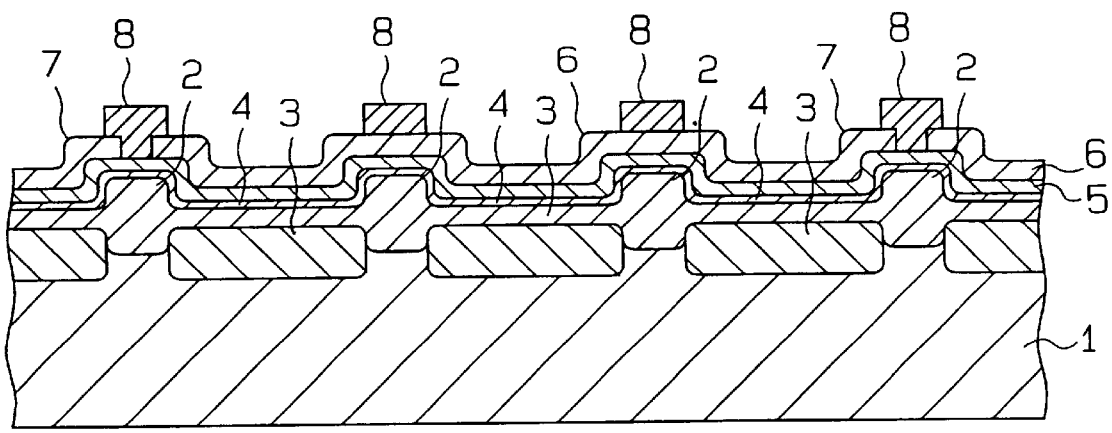
FIG. 3A is a cross-sectional view taken along the line 3A—3A shown in FIG. 2.
Figure 3B:
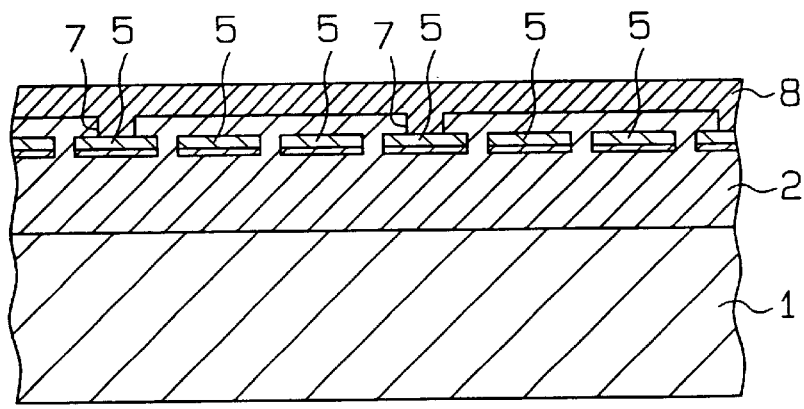
FIG. 3B is a cross-sectional view taken along the line 3B—3B shown in FIG. 2.
Figure 4A:
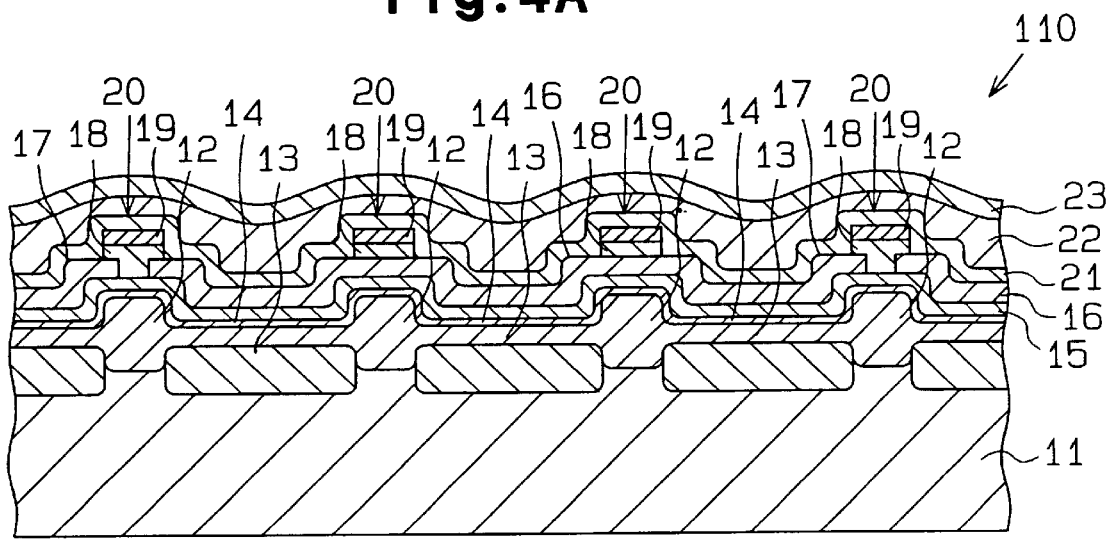
FIGS. 4A and 4B are cross-sectional views of an image sensing part of a solid state image sensing device of the present invention.
Figure 4B:
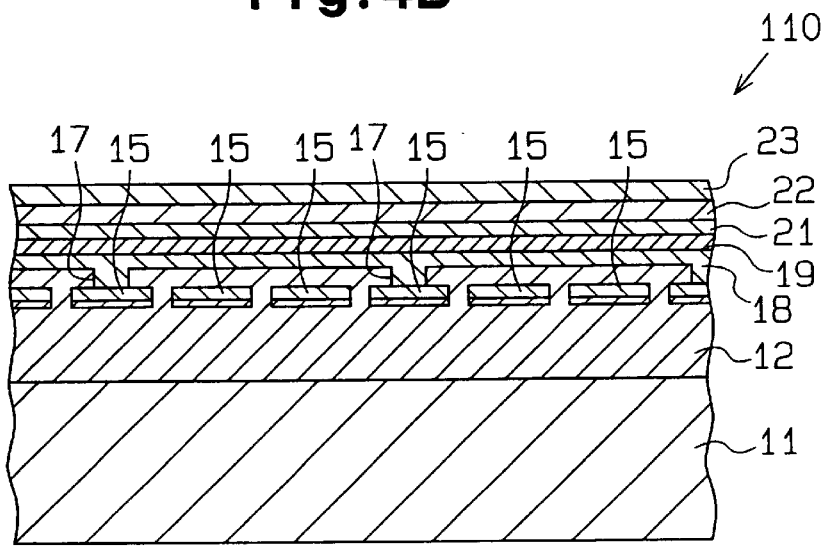

FIGS. 4A and 4B are cross sections similar to FIGS. 3A and 3B, respectively, illustrating a portion of an image sensing part 110 of a solid state image sensing device according to an embodiment of the present invention.

As shown in FIGS. 4A and 4B, from a silicon substrate 11 to a transfer electrode 15, the solid state image sensing device is substantially identical to the solid state image sensing device 100 shown in FIG. 3. Specifically, a plurality of channel isolation regions 12 are formed on the surface of a P-type silicon substrate 11 run parallel to each other. N-type diffusion layers 13 are formed between the isolation regions 12, and a plurality of transfer electrodes 15 are disposed on top of the isolation regions 12 and the diffusion layers 13 with gate insulation layers 14, which preferably comprise silicon oxide, interposed therebetween. In the solid state image sensing device, a light receiving pixel includes a channel area formed between the diffusion layer 13 which comprises silicon and the insulation layer 14 which comprises silicon oxide. The channel isolation region 12 may be formed by a P-type area of a high concentration or by a combination of a thick oxide film and a P-type area.

An interleave insulation layer 16 comprising silicon oxide is laminated on top of the silicon substrate 11 on which the transfer electrodes 15 are formed, thus covering the transfer electrodes 15. Via holes 17 are formed in the interleave insulation layer 16 at given locations. A polycrystalline silicon or poly-silicon layer 18 is laminated on the interleave insulation layer 16 at a location above the isolation region 12, and is connected to the transfer electrodes 15 thereunder through the via holes 17. As in FIG. 3, the via holes 17 are located to correspond to every third transfer electrode 15.

Laminated on the poly-silicon layer 18 is a silicide layer 19 which preferably comprises silicon combined with a refractory metal such as tungsten, molybdenum, titanium or the like. The pair of poly-silicon layer 18 and silicide layer 19 together defines a power supply line 20 of a polycide structure. The silicide layer 19 in the power supply line 20 exhibits a reduced optical reflectivity as compared with aluminum, so that irregular reflections of light on the surface of the power supply line 20, and hence the incidence of light reflected by the power supply line onto channel areas (light receiving pixels) are reduced.

An insulation layer 21, preferably comprising silicon oxide, is laminated on the silicon substrate 11 on which the power supply lines 20 are formed, thus covering the power supply lines 20. A planarization layer 22, preferably comprising PSG (phospho-silicate glass) or boro-phospho silicate glass, is laminated on the insulation layer 21, and a surface protective film 23 is formed on the surface of the planarization layer 22. The surface protective film 23 which preferably comprises silicon nitride and contains an increased quantity of hydrogen, and thus serves as a source of hydrogen so that supplied to the silicon/silicon oxide interface of the channel area. Specifically, a thermal treatment of the surface protective film 23 which takes place subsequent to the formation thereof allows hydrogen contained in the surface protective film 23 (silicon nitride) to be supplied to the silicon/silicon oxide interface of the channel area or to the surface of the diffusion layer 13.

With respect to the supply of hydrogen, it will be noted that because the power supply line 20 of the polycide structure has reduced absorptive power of hydrogen as compared with aluminum, it does not interfere with the supply of hydrogen to the silicon/silicon oxide interface of the channel area. Accordingly, a sufficient quantity of hydrogen is supplied to the silicon/silicon oxide interface of the channel area, and thus the unsaturated bond in the channel area can be compensated for in a reliable manner. Because the power supply line 20 comprises a silicide of a refractory metal, it is capable of withstanding thermal treatment at an elevated temperature, allowing the temperature of the thermal treatment which introduces hydrogen to be chosen high. A thermal treatment at an elevated temperature reduces the length of time needed to supply hydrogen.

FIGS. 5A to 5D are a series of cross-sectional views illustrating steps of a method of manufacturing a solid state image sensing device according to an embodiment of the invention, generally showing similar parts as shown in FIGS. 4A.

(a): First Step

Figure 5A:
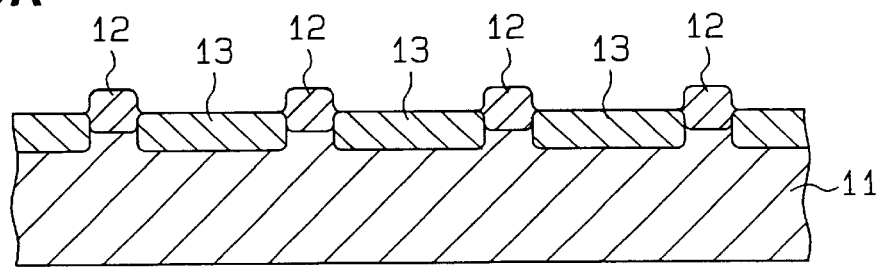
FIGS. 5A to 5D are a series of cross-sectional views illustrating a method of manufacturing the solid state image sensing device according to the present invention.

As shown in FIG. 5A, a selective oxidation process is used to grow a silicon oxide film on the surface of a P-type silicon substrate 11, forming a plurality of channel isolation regions 12, which extend vertically and have a given spacing therebetween. An N-type impurity such as phosphorus is implanted into regions located between the channel isolation regions 12 to form diffusion layers 13 which provide respective channel areas.

(b): Second Step

Figure 5B:
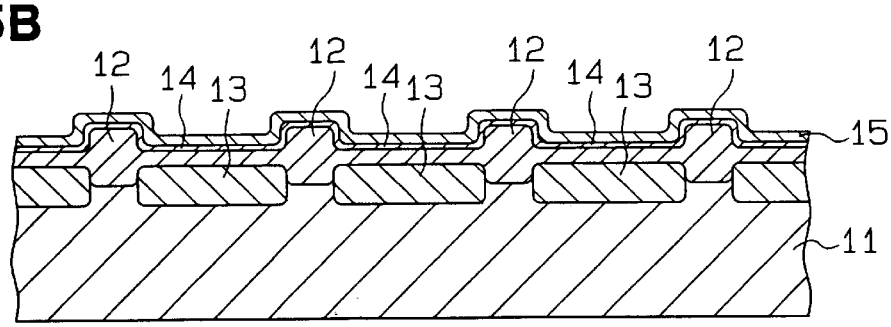

As shown in FIG. 5B, the surface of the silicon substrate 11 inclusive of the diffusion layers 13 is thermally oxidized to form the gate insulation layers 14. During the thermal oxidation, a silicon oxide film is also formed on the surface of the channel isolation region 12. Subsequently, polycrystalline silicon (polysilicon) is deposited on top of the gate insulation layers 14 by a CVD (chemical vapor deposition) process to form a polysilicon film, which is then patterned into a given configuration which traverses the channel isolation regions 12, forming a plurality of transfer electrodes 15.

(c): Third Step

Figure 5C:
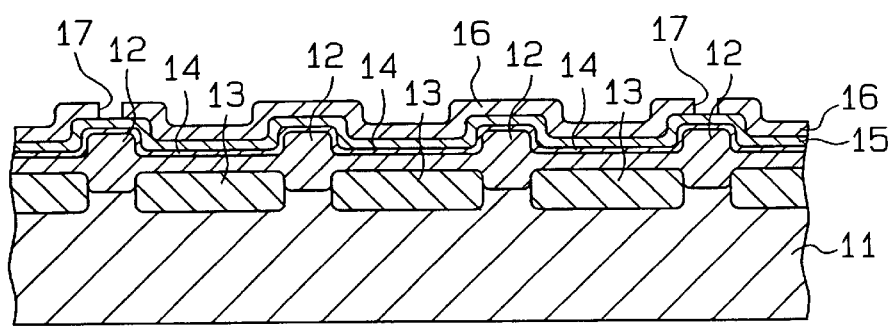
Figure 5D:
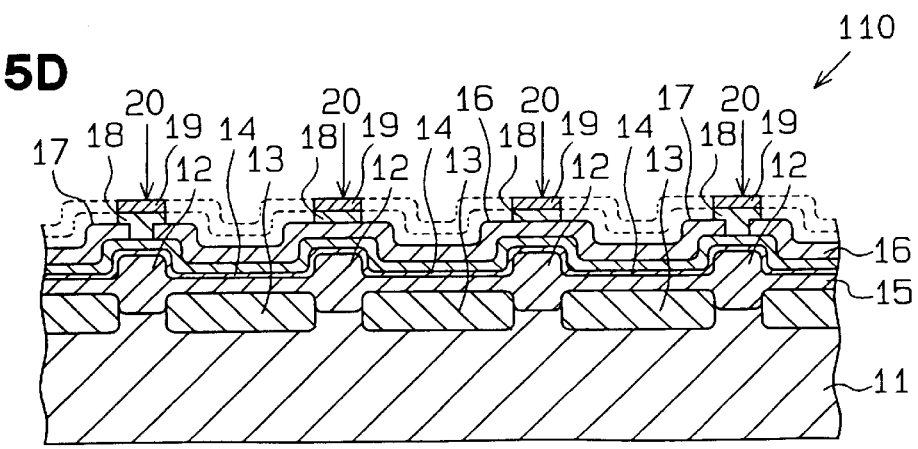

As shown in FIG. 5C, the CVD process is used to deposit silicon oxide, thus forming an interleave insulating film 16 on top of the plurality of transfer electrodes 15. Via holes 17 are formed in the interleave insulation layer 16 at locations above the channel isolation regions 12 at a given spacing, which may correspond to every third channel isolation region 12 for a three phase drive system.

(d): Fourth Step

As shown in FIG. 5 D, a polysilicon layer 18 is deposited on top of the interleave insulation layer 16 using the CVD process, and a silicide layer 19 is deposited on top of the interleave insulation layer 16, forming a conductive layer having a polycide structure. The conductive layer may be patterned to form power supply lines 20 which intersect with the transfer electrodes 15 and extend along the channel isolation regions 12.

After the power supply lines 20 are formed, a silicon oxide is deposited by the CVD process using TEOS (tetraethyl orthosilicate), to form the insulation layer 21 which covers the power supply lines 20, as shown in FIG. 4A. PSG is then deposited using the CVD process and fluidized by a thermal treatment, forming the planarization layer 22 on the insulation layer 21.

Subsequently, silicon nitride is deposited on the surface of planarization layer 22 by the plasma CVD process to form the surface protective film 23. Silicon nitride formed by the plasma CVD process normally contains quantities of hydrogen, and serves as a source of hydrogen to the silicon substrate 11.

When the entire silicon substrate 11 is thermally treated, hydrogen contained in the surface protective film 23 (silicon nitride) is supplied to the surface of the silicon substrate 11 by diffusion. The hydrogen compensates for the unsaturated bond at the silicon/silicon oxide interface of the channel area, lowering the interface level with a consequent decrease in the dark current which is produced in the channel area. By measurement, it has been confirmed that an output voltage attributable to the dark current is reduced to the order of from ½ to ⅓ times that which prevails when the power supply lines 20 comprise aluminum.

It should be apparent to those skilled in the art that the present invention may be embodied in many other specific forms without departing from the spirit or scope of the invention. Particularly, it should be understood that the invention may be embodied in the following forms.

The present invention may be applied to a solid-state image sensing device comprising a two-layer disposition structure in which the adjacent transfer electrodes 15 overlap each other. The transfer clock applied to the transfer electrodes is not restricted to three-phases, but may apply to two, four or more phases.

In this instance, the layout of via holes between the transfer electrodes and the power supply lines is modified according to the number of phases used in the drive.

The silicide layer 19 in the power supply line 20 may comprise a single layer or may be replaced by another refractory metal. In the latter instance, the thermal treatment which follows the deposition of the refractory metal causes it to be combined with the polysilicon.

Therefore, the present examples and embodiments are to be considered as illustrative and not restrictive and the invention is not to be limited to the details given herein, but may be modified within the scope and equivalence of the appended claims.

What is claimed is:

1. A solid state image sensing device employing a frame transfer system, the device comprising:
    a semiconductor substrate;
    a plurality of isolation regions extending in one direction on said semiconductor substrate, said isolation regions extending generally parallel to each other with a given spacing therebetween;
    a plurality of channel regions disposed on said semiconductor substrate between adjacent said isolation regions, at least one of said plurality of channel regions contacting more than one of said plurality of isolation regions;
    a plurality of transfer electrodes extending parallel to each other in a direction to intersect with said plurality of channel regions above said semiconductor substrate; and
    a plurality of power supply lines directly connected to said plurality of transfer electrodes and extending along and over said plurality of isolation regions but not over said plurality of channel regions, wherein each of said power supply lines includes a poly-silicon layer directly connected to the transfer electrodes and one of a refractory metal layer and a silicide layer, which are formed on the poly-silicon layer, and wherein the silicide layer is formed by a refractory metal combined with silicon.

2. A method of manufacturing a solid state image sensing device employing a frame transfer system, the method comprising the steps of:
    forming a plurality of isolation regions extending generally parallel to each other on a semiconductor substrate and forming a channel region between and contacting adjacent isolation regions;
    depositing a first insulation layer on said isolation regions and said semiconductor substrate on which said plurality of isolation regions and said plurality of channel regions are formed, and forming a plurality of transfer electrodes on said first insulation layer that extend in a direction to intersect with said plurality of isolation regions;
    depositing a second insulation layer on said plurality of transfer electrodes and forming via holes in said second insulation layer at points of intersection between said respective isolation regions and said respective transfer electrodes;
    forming a plurality of power supply lines on said second insulation layer that extend along and over said isolation regions but not over any channel region; and depositing a third insulation layer on said power supply lines and subsequently conducting a thermal treatment;

wherein said power supply line forming step includes:

forming a poly-silicon layer on said second insulation layer, wherein said poly-silicon layer is directly connected to said transfer electrodes thereunder by said holes; and forming either a refractory metal layer or a silicide layer on the polysilicon layer, wherein the silicide layer is formed by a refractory metal combined with silicon.

3. A solid state image sensing device employing a frame transfer system, the device comprising:

a substrate having a plurality of channel isolation regions formed thereon that extend generally parallel to each other;

a plurality of diffusion regions, respectively formed between and contacting said channel isolation regions;

a plurality of transfer electrodes located above said substrate on which said isolation regions and said diffusion regions are formed;

a gate insulation layer located between said transfer electrodes and said substrate;

an interleave insulation layer covering said transfer electrodes, said interleave insulation layer having via holes formed therein;

a poly-silicon layer formed on said interleave insulation layer above and along said channel isolation regions and directly connected to said transfer electrodes thereunder by said via holes, said poly-silicon layer not extending over the plurality of diffusion regions formed between said plurality of channel isolation regions; and a silicide layer formed on said poly-silicon layer, said poly-silicon layer and said silicide layer forming a power supply line, wherein said silicide layer has a reduced optical reflectivity that inhibits reflections of light on a surface of said power supply line.

4. The solid state image sensing device of claim 3, further comprising:

an insulation layer covering said power supply lines; and a planarization layer formed on said insulation layer.

5. The solid state image sensing device of claim 4, wherein said planarization layer comprises phospho-silicate glass or boro-phospho silicate glass.

6. The solid state image sensing device of claim 5, further comprising:

a surface protective film formed on said planarization layer.

7. The solid state image sensing device of claim 6, wherein said surface protective film comprises silicon nitride having an increased quantity of hydrogen that is supplied to a surface of said diffusion layers.

8. The solid state image sensing device of claim 3, wherein said silicide layer comprises silicon combined with a refractory metal.

* * * * *